US009377489B2

(12) United States Patent
Wallace et al.

(10) Patent No.: US 9,377,489 B2
(45) Date of Patent: Jun. 28, 2016

(54) SYSTEMS AND METHODS FOR MONITORING FIBER OPTIC CURRENT SENSING SYSTEMS (71) Applicant: General Electric Company, Schenectady, NY (US)

(72) Inventors: Daniel Robert Wallace, Fulton, NY (US); Paul Edward Marken, Columbia City, IN (US)

(73) Assignee: General Electric Company, Schenectady, NY (US)

(*) Notice: Subject to any disclaimer, the term of this patent is extended or adjusted under 35 U.S.C. 154(b) by 219 days.

(21) Appl. No.: 14/253,300

(22) Filed: Apr. 15, 2014

(65) Prior Publication Data
US 2015/0293154 A1 Oct. 15, 2015

(51) Int. Cl.
*G01R 31/00* (2006.01)
*G01R 15/22* (2006.01)
*G01R 15/24* (2006.01)
*G01R 31/28* (2006.01)

(52) U.S. Cl.
CPC .............. *G01R 15/22* (2013.01); *G01R 15/245* (2013.01); *G01R 31/2829* (2013.01)

(58) Field of Classification Search
CPC ....... G01R 15/246; G01R 15/242; G01R 1/71
USPC .............................. 324/96, 250, 343, 356, 97
See application file for complete search history.

(56) References Cited

U.S. PATENT DOCUMENTS

| 4,612,500 | A | * | 9/1986 | Chen ................. G01R 19/15 324/105 |
| 5,149,962 | A | | 9/1992 | Maurice |
| 5,847,560 | A | | 12/1998 | Bosselmann et al. |
| 6,434,285 | B1 | * | 8/2002 | Blake ................. G01R 31/02 250/225 |

(Continued)

FOREIGN PATENT DOCUMENTS

EP 0458429 A2 11/1991
EP 1857824 A1 11/2007

OTHER PUBLICATIONS

European Search Report and Opinion issued in connection with corresponding EP Application No. 15161283.5 on Sep. 14, 2015.

(Continued)

*Primary Examiner* — Tung X Nguyen
*Assistant Examiner* — Dominic Hawkins
(74) *Attorney, Agent, or Firm* — Parks IP Law LLC; Stephen J. Terrell (57) ABSTRACT A system includes a light source configured to generate a source of light, a fiber optic current sensor (FOCS) configured to detect the source of light, and a decoding circuitry communicatively coupled to the FOCS. The system also includes a health monitoring circuitry communicatively coupled to the decoding circuitry. The health monitoring circuitry is configured to receive a first electrical characteristic component of the first signal and a corresponding second electrical characteristic component of the second signal, to generate a summation of the first electrical characteristic component of first signal and the second electrical characteristic component of the second signal, and to generate an output signal based at least in part on the summation of the first electrical characteristic component and the second electrical characteristic component. The output signal includes an indication of an operational condition of the light source.

20 Claims, 5 Drawing Sheets

(56) References Cited

U.S. PATENT DOCUMENTS

| | | |
|---|---|---|
| 6,504,355 B2 | 1/2003 | Minier |
| 6,636,321 B2 | 10/2003 | Bohnert |
| 6,670,799 B1 | 12/2003 | Bull et al. |
| 7,233,746 B2 | 6/2007 | Blake et al. |
| 7,493,052 B2 | 2/2009 | Blake et al. |
| 7,655,900 B2 | 2/2010 | Kurosawa et al. |
| 7,786,719 B2 | 8/2010 | Kurosawa et al. |
| 7,911,196 B2 | 3/2011 | Bohnert |
| 8,242,402 B2 | 8/2012 | Bohnert et al. |
| 8,395,372 B2 | 3/2013 | Harlev et al. |
| 8,781,266 B2 | 7/2014 | Lee et al. |
| 2002/0011831 A1 | 1/2002 | Minier |
| 2004/0021100 A1* | 2/2004 | Gouzman ............ G01F 23/2927 250/573 |
| 2006/0170410 A1* | 8/2006 | Bjorn .................... G01R 15/246 324/96 |
| 2010/0194379 A1 | 8/2010 | Kurosawa |
| 2010/0253320 A1 | 10/2010 | Kurosawa |
| 2010/0309473 A1* | 12/2010 | Sanders ............... G01R 15/246 356/460 |
| 2011/0141478 A1* | 6/2011 | Sasaki ................ G01R 19/0092 356/483 |
| 2012/0187937 A1* | 7/2012 | Blake .................. G01R 33/032 324/96 |
| 2013/0161483 A1* | 6/2013 | Borodin ................. H04J 14/02 250/201.1 |
| 2014/0361762 A1* | 12/2014 | Wallace ............... G01R 15/246 324/96 |

OTHER PUBLICATIONS

Kurosawa et al., "Development of Optical Fiber Current Senors and Their Applications", IEEE/PES Transmission and Distribution Conference & Exhibition: Asia and Pacific, Dalian, China, 2005, pp. 1-6.

Sawa et al., "Development of Optical Instrument Transformers", IEEE Transactions on Power Delivery, vol. 5, No. 2, Apr. 1990, pp. 884-891.

U.S. Appl. No. 13/913,832, filed Jun. 10, 2013, Wallace et al.

* cited by examiner

SYSTEMS AND METHODS FOR MONITORING FIBER OPTIC CURRENT SENSING SYSTEMS

BACKGROUND OF THE INVENTION

The invention relates generally to fiber optic current sensing systems, and more particularly, to the monitoring of the operational health and condition of one or more components of the fiber optic current sensing system.

Fiber optic current sensors (FOCSs) and/or fiber optic current transducers (FOCTs) measure electrical current according to what may be generally referred to as the Faraday Effect. Specifically, the interaction of light with a medium (e.g., electric power conductor) in a magnetic field causes a rotation of the plane of polarization of the light by an angle that may be linearly proportional to a component of the magnetic field in a direction of propagation of the light. The polarization of the light may be then measured to determine the magnitude of the current flowing through, for example, a power conductor. However, certain components of FOCS systems and/or FOCT systems may be susceptible to degradation over time. Thus, if semi-regular preventive maintenance is not performed, the respective systems may become less effective in measuring the current. It may be useful to provide a system to monitor the operational health of FOCS and/or FOCT systems.

BRIEF DESCRIPTION OF THE INVENTION

Certain embodiments commensurate in scope with the existing claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a light source configured to generate a source of light, a fiber optic current sensor (FOCS) configured to detect the source of light, and a decoding circuitry communicatively coupled to the FOCS. The decoding circuitry is configured to receive the source of light as indication of a measurement of an electrical current and to generate a first signal and a second signal based thereon. The system also includes a health monitoring circuitry communicatively coupled to the decoding circuitry. The health monitoring circuitry is configured to receive a first electrical characteristic component of the first signal and a corresponding second electrical characteristic component of the second signal, to generate a summation of the first electrical characteristic component of first signal and the second electrical characteristic component of the second signal, and to generate an output signal based at least in part on the summation of the first electrical characteristic component and the second electrical characteristic component. The output signal includes an indication of an operational condition of the light source.

In a second embodiment, a system includes fiber optic detection circuitry. The fiber optic detection circuitry includes electrical current detection circuitry configured to generate a current measurement output based on a returning light intensity received via a fiber optic current sensor, and fiber optic health detection circuitry communicatively coupled to the electrical current detection circuitry. The fiber optic health detection circuitry is configured to extract a first electrical characteristic component of the current measurement output and a second electrical characteristic component of the current measurement output, and to generate an output signal based at least in part on an adjusted summation of the first electrical characteristic component and the second electrical characteristic component. The output signal includes an indication of an operational health of a light source communicatively coupled to the fiber optic current sensor.

In a third embodiment, a system includes a laser configured to generate a light beam, a fiber optic current transducer (FOCT) configured to detect the light beam, and a decoding circuitry communicatively coupled to the FOCT. The decoding circuitry is configured to receive the light beam as an indication of a measurement of an electrical current and to generate a first signal and a second signal based thereon. The system also includes a first monitoring circuitry communicatively coupled to the decoding circuitry. The first monitoring circuitry is configured to receive a direct current (DC) component of the first signal and a DC component of the second signal, and to generate an output signal based at least in part on a summation of the DC component of the first signal and the DC component of the second signal. The output signal includes an indication of an operational condition of the laser or the decoding circuitry. The system also includes a second monitoring circuitry communicatively coupled to the decoding circuitry and the first monitoring circuitry. The second monitoring circuitry is configured to receive an alternating current (AC) component of the first signal and an AC component of the second signal, and to generate a second output signal based at least in part on a second summation of a first characteristic of the AC component of the first signal and a second characteristic of the AC component of the second signal. The second output signal includes a second indication of an operational condition of one or more components of the decoding circuitry.

BRIEF DESCRIPTION OF THE DRAWINGS

These and other features, aspects, and advantages of the present invention will become better understood when the following detailed description may be read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," and "the" are intended to mean that there are one or more of the elements. The terms "comprising," "including," and "having" are intended to be inclusive and mean that there may be additional elements other than the listed elements.

The present embodiments relate to a fiber optic current sensing device, which may include fiber optic operational health monitoring circuitry to provide diagnostic information about the operation and functionality of the fiber optic current sensing device. For example, the operational health monitoring circuitry may be included as part of the fiber optic current sensing device specifically to provide diagnostic data regarding the operation of the fiber optic current sensing device itself. Specifically, the operational health monitoring circuitry may monitor the direct current (DC) components of detected current signals for a variation in offset voltage outside of an expected and/or specified voltage range, which may be indicative of a failing operational health or condition of a light source or other components of the fiber optic current sensing device. In another embodiment, the operational health monitoring circuitry may monitor the alternating current (AC) components of detected current signals as an indication of a failing operational health of one or more high pass filters that may be included in the fiber optic operational health monitoring circuitry. In this way, the operational health monitoring circuitry may produce an external output signal (e.g., which may be output to a protection device or a utility control center) that be used to monitor the operational health and/or robustness of the light source and indicate when and/or if preventative maintenance may be required. Specifically, by providing the fiber optic operational health monitoring circuitry, a utility or other utility service provider may be provided with real-time or near time diagnostic information regarding, for example, power attenuation or gain of the light source, insertion loss and/or isolation, and so forth. This may contribute to greater reliability of the fiber optic current sensing device, and, thus allow for an increase in the accuracy of current measurements made by the fiber optic current sensing device, as well as the widespread utilization of fiber optic current sensing devices as opposed to other current sensors such as core-based current transformers (CT) and/or Rogowski coils.

Figure 1:
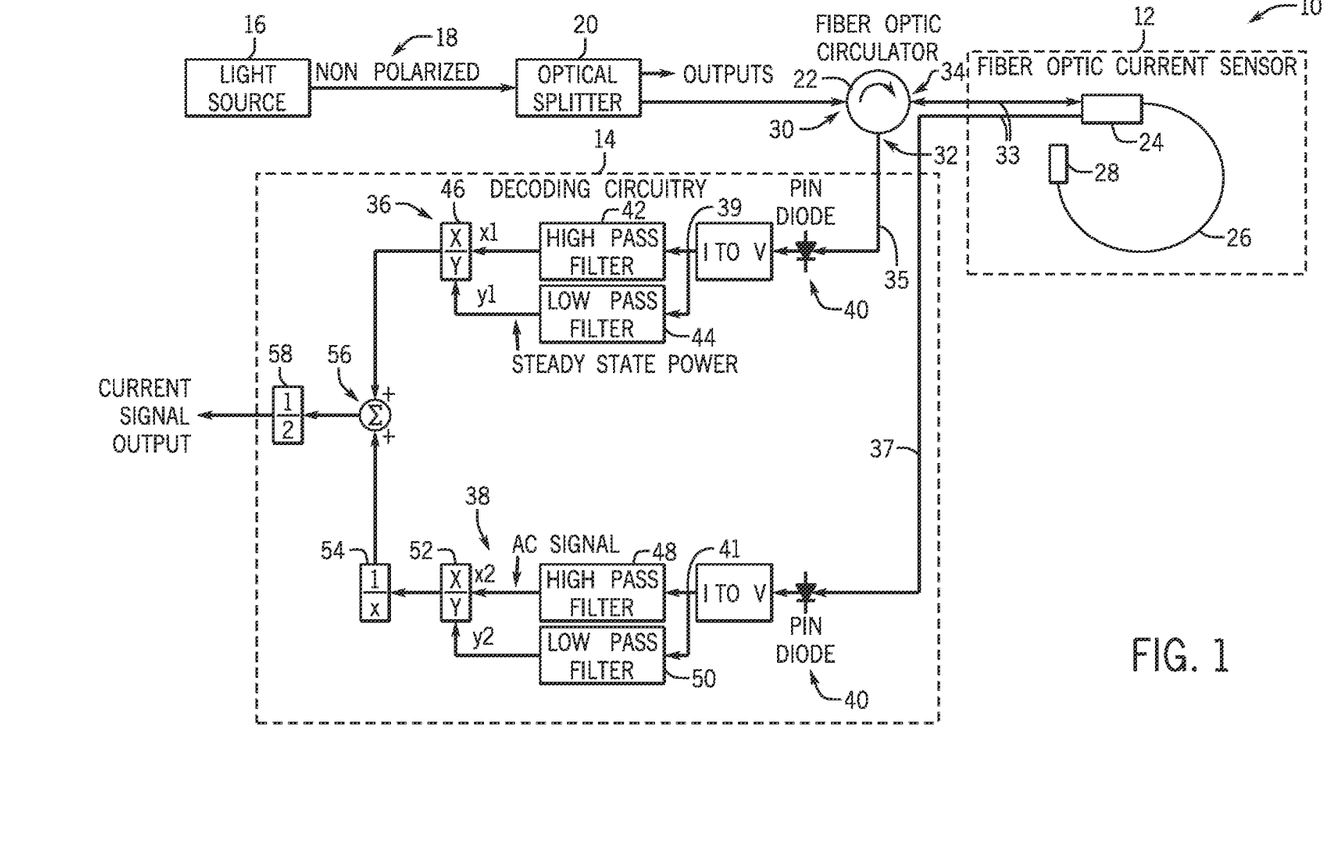
FIG. 1 is a block diagram of an embodiment of a fiber optic current sensing system, in accordance with the present embodiments.

With the foregoing in mind, it may be useful to describe an embodiment of a fiber optic current sensing system, such as the fiber optic current sensing system 10 illustrated in FIG. 1. The fiber optic current sensing system 10 may include a system for measuring a current flowing through, for example, one or more electric power conductors. As illustrated, the system 10 may include a fiber optic current sensor (FOCS) 12 (e.g., or other fiber optic current transducer (FOCT)), which may be coupled to a light source 16 that outputs a light 18 to an optical splitter 20 and an optical circulator 22 along, for example, an optical fiber. As further illustrated, the fiber optic current sensor 12 may be communicatively coupled to decoding circuitry 14. The fiber optic current sensor 12 may include an optical box 24, a flint glass fiber 26, and a reflective surface 28.

In one embodiment, the light 18 may be a non-polarized light beam having a wavelength between approximately 1310-1550 nanometers (nm). Alternatively, the light 18 may be any form of light that may be useful in allowing the fiber optic current sensor 12 and the decoding circuitry 14 to detect electrical current. As further depicted, the light 18 may be passed to the optical splitter 20. In certain embodiments, the optical splitter 20 may include 1-to-10 optical splitter useful in splitting the light 18 amongst approximately ten channels or more. That is, the output of the light source 16 may be split to produce a separate light 18 for each channel.

In certain embodiments, the optical circulator 22 may include a three-port circulator that may allow light (e.g., light 18) entering one port to exit from another port. Specifically, the light 18 may enter the optical circulator 22 at a first port 30, and exit the optical circulator 22 at a second port 34. In certain embodiments, the light exiting second port 34 may be supplied to the optical box 24 of a fiber optic current sensor 12 via a multidirectional optical fiber. The light 18 may enter the optical box 24, and may be transmitted through the flint glass fiber 26. The light 18 may then reflect off of the reflective surface 28 (e.g., a mirror), and return to the optical box 24 via flint the glass fiber 26.

When a current flows through, for example, a power conductor (e.g., power distribution line and/or power transmission line) to which the fiber optic current sensor 12 may be coupled, a polarization angle of the light 18 may be rotated by an amount proportional to a magnitude of the current passing through conductor (e.g., by way of the Faraday Effect). As will be further appreciated, the optical box 24 may then output the rotated light 18 as two different polarizations, x-polarization light 35 and y-polarization light 37. The polarization of y-polarization light 37 may be offset 90° with respect to x-polarization light 35. If no current flows through, for example, the electric power conductor, a magnitude of x-polarization light 35 may be equal to a magnitude of y-polarization light 37. On the other hand, if current flows through the conductor, the magnitude of the x-polarization light 35 and the magnitude of the y-polarization light 37 may be unequal.

In certain embodiments, the x-polarization light 35 may travel along the multidirectional optical fiber 33 and enter the optical circulator 22 at the second port 34. The x-polarization light 35 may then exit the optical circulator 22 at a third port 32, and may be supplied to one or more diodes 40 (e.g., PIN diode) of the monitoring circuit 14. Specifically, the monitoring circuit 14 may include an x-polarization light 35 processing circuitry 36 and y-polarization processing circuitry 38. The y-polarization light 37 may be supplied to a similar diode 40 (e.g., PIN diode) of the y-polarization processing circuitry 38 via a similar optical fiber. The one or more diodes 40 may respectively convert the x-polarized light 35 and y-polarized light 37 into the illustrated first and second electrical signals 39 and 41.

In certain embodiments, the x-polarization processing circuitry 36 may split the electrical signal 39 and pass the electrical signal 39 through a high pass filter 42 and a low pass filter 44. The high pass filter 42 may isolate an alternating current (AC) component of the electrical signal 39, and first low pass filter 44 to isolate a direct current (DC) component of the electrical signal 39. As further illustrated, a divider 46 may divide the AC component of the electrical signal 39 by DC component of the electrical signal 39. Specifically, the output of the divider 46 may represent the current magnitude of the conductor (e.g., power line) being monitored by the fiber optic current sensor 12.

Similarly, the y-polarization processing circuit 38 may split the electrical signal 41 and pass the electrical signal 41 through a high pass filter 48 and a low pass filter 50. The high pass filter 48 may isolate the AC component of the electrical signal 41, and the low pass filter 50 may isolate the DC component of the electrical signal 41. A divider 52 may then divide the AC component of the electrical signal 41 by the DC component of the electrical signal 41. In some embodiments, the y-polarized light 37 may be approximately 180° out of phase with x-polarized light 35, and thus the y-polarization processing circuitry 38 may further include a reciprocator 54 (e.g., which may be implemented via hardware, software, or a combination thereof) that may be used to generate a reciprocal value of the output of the divider 52. In some embodiments, the DC components of the respective signals 39 and 41 may be indicative of the power or intensity of light source 16 in units of watts (W). For example, in one embodiment, during normal operating conditions of the system 10, the power of light source 16 may include a light intensity of approximately 100 microwatts (uW). However, it should be appreciated that the light source 16 may output light 18 having various values of light intensity.

As further depicted in FIG. 1, the decoding circuitry 14 may also include summer 56, which may, for example, be implemented in hardware, software, or a combination thereof, and may be used to receive and sum the respective outputs of the divider 46 and the reciprocator 54. An output divider 56 may then multiply the output of summer 56 by one half, for example, output multiplier and/or divider 58. The signal output provided by the output divider 56 may be a voltage signal output indicative of the current flowing through, for example, one or more electric power conductors to which the fiber optic current sensor 12 may be coupled. As will be further appreciated, in certain embodiments, it may be useful to monitor the operational health and condition of the fiber optic current sensing system 10, and, more specifically, the operational health and condition of the light source 16 and/or the fiber optic sensor 12 so as to allow for more accurate information related to the currents passing through the electric power conductors (e.g., electric power lines) to be assessed.

Specifically, in some embodiments, the light source 16 may be susceptible to degradation over time, and, by extension, the output (e.g., light 18) of the light source 16 may be susceptible to undesirable attenuation. If left unchecked or without preventive maintenance, the light source 16, and, by extension, the fiber optic sensor 12 may become less effective in providing an accurate measure of the current flowing through, for example, an electric power conductor. However, a utility serviceman or engineer may not have any indication as to the operational health of the light source 16 and/or the fiber optic sensor 12, and thus the light source 16 and/or the fiber optic sensor 12 may possibly become ineffective in accurately measuring the current output (e.g., current signal output as illustrated in FIG. 1) while in service. For example, should the current signal output measure a value of approximately 0 Amps or other aberrantly low value, the utility and/or utility serviceman may not have any indication as to whether this is the result of a lost electric power line, or the result of one or more components of the fiber optic current sensing system 10 possibly failing. Accordingly, it may be useful to provide fiber optic sensor health monitoring circuitry as part of the decoding circuitry 14 that may be used to produce an external signal indicative of the operational health of the light source 16 and/or the fiber optic sensor 12.

Figure 2:
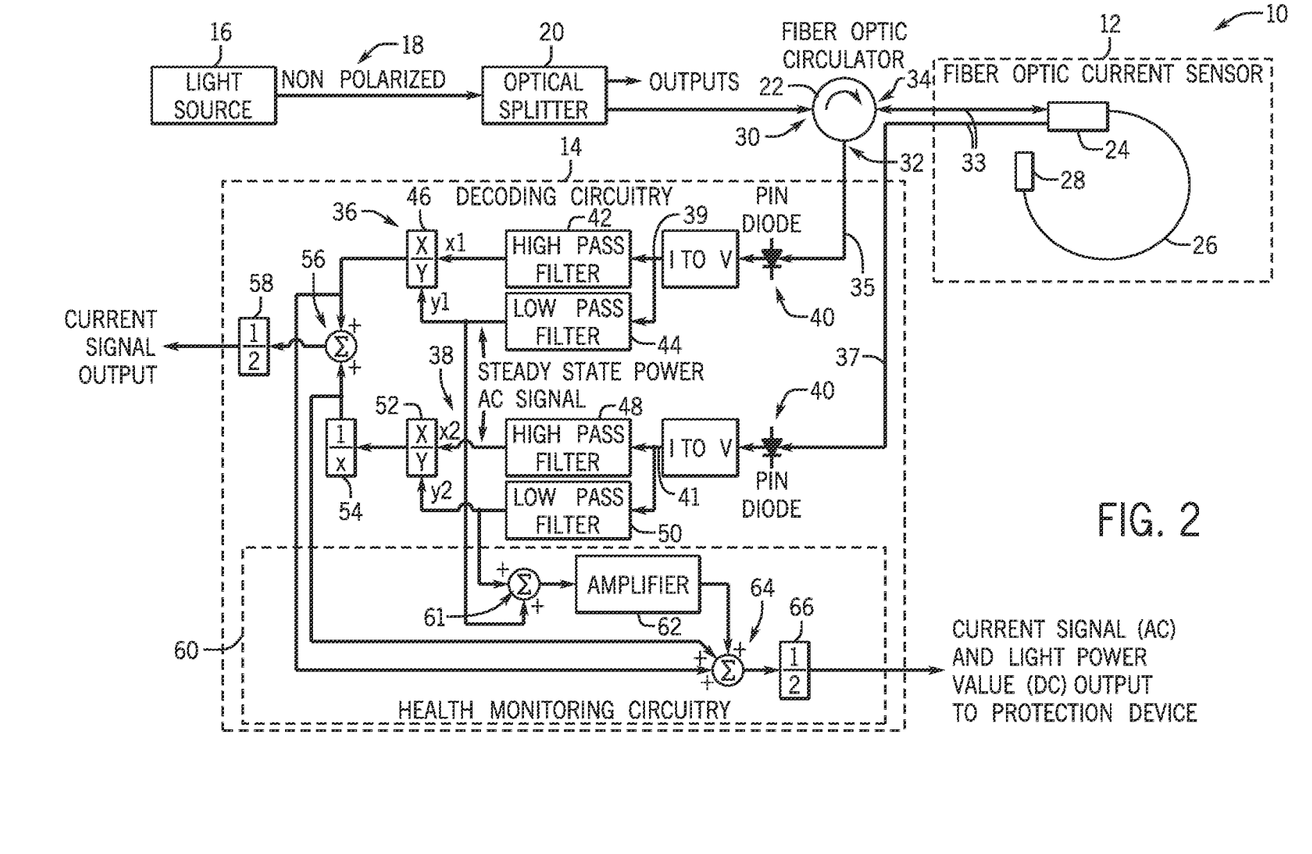
FIG. 2 is an embodiment of the fiber optic current sensing system of FIG. 1 including a monitoring circuit, in accordance with the present embodiments.

Turning now to FIG. 2, which illustrates an embodiment of the fiber optic current sensing system 10, in which the decoding circuitry 14 may include health monitoring circuitry 60. In certain embodiments, the health monitoring circuitry 60 may include hardware, software, or a combination of hardware and software useful in monitoring the operational health and/or the operational state of the light source 16 and/or the fiber optic sensor 12. As illustrated in FIG. 2, the health monitoring circuitry 60 may be included as part of the decoding circuitry 14. However, in other embodiments, it should be appreciated that the health monitoring circuitry 60 may be provided as an external system to the decoding circuitry 14.

In certain embodiments, the health monitoring circuitry 60 may provide an indication of the operational health and/or the operational state of the light source 16 and/or the fiber optic sensor 12 based on, for example, an offset of the output signal indicating the power or intensity of the light 18 of the light source 16. Specifically, the health monitoring circuitry 60 may provide an indication of the operational health and/or the operational state of the light source 16 and/or the fiber optic sensor 12 based on the DC component of the respective signals 39 and 41 (e.g., y1, y2). Thus, as illustrated, the health monitoring circuitry 60 may be coupled (e.g., electrically coupled) to the output (e.g., output y1) of the low pass filter 44 and the output (e.g., output y2) of the low pass filter 50.

In certain embodiments, by monitoring the DC components of the signal 39 and the DC components of the signal 41, the monitoring circuit 60 may provide an indication of the operational health and/or the operational state of the light source 16 and/or the fiber optic sensor 12, as the respective DC components (e.g., DC offsets) of the signals 39 and 41 may be within a expected voltage and/or current range when the operational health and/or the operational state of the light source 16 and the fiber optic sensor 12 are functional. Thus, variation from the expected and/or specified voltage range may be indicative of failing operational health of the light source 16 and/or the fiber optic sensor 12, or less than desirable operational health of the light source 16 and/or the fiber optic sensor 12.

In certain embodiments, as further illustrated by FIG. 2, the health monitoring circuitry 60 may receive the respective DC components (e.g., DC offsets) of the signals 39 and 41 (e.g., y1, y2) and sum the respective DC components via a summing device 61. The summing device 61 may, in some embodiments, include a combination of hardware and software systems useful in combining two or more signals. The summing device 61 may then pass the sum of the DC components of the signals 39 and 41 (e.g., y1, y2) to an amplifier 62. The amplifier 62 may include, for example, one or more active solid state devices (e.g., transistor, field effect transistor (FET), and so forth) or other amplifying electronic device (e.g., operational amplifier (OpAmp)) that may be used to provide a power gain (G) (e.g., an increase or decrease in power level measured as a ratio of output power to input power or in units of decibels dB) to the output signal of the summing device 61, and, by consequence, the input signal to the amplifier 62. Thus, the amplifier 62 may amplify the sum of the DC components of the signals 39 and 41 (e.g., y1, y2). In one embodiment, the power gain (G) of the amplifier 62 may be a gain ratio value of approximately 0.05. However, it should be appreciated that other gain values may be used.

As further depicted, the output of the amplifier 62 may be summed with the output of the divider 46 (e.g., output corresponding to a quotient value of the AC component and the DC component of the electrical signal 39) and the output of the reciprocator 54 (e.g., output corresponding to the reciprocal value of the quotient value of AC component and the DC component of the electrical signal 41) via a summing device 64. Specifically, the aforementioned signals may be summed to reduce the number of outputs to be provided to an external control system (e.g., external monitor as illustrated in FIG. 2). In this way, a single output may be provided as an indication of the operational health of the light source 16, the fiber optic sensor 12, and/or certain components of the decoding circuitry 14 as opposed to multiple outputs. However, in other embodiments, it should be appreciated that, the respective signals themselves may provide at least some indication of the operational health of the light source 16, the fiber optic sensor 12, and/or certain components of the decoding circuitry 14.

In certain embodiments, the summing device 64 may be substantially similar to the summing device 61. A multiplier 66 of the health monitoring circuitry 60 may then receive the output of the summing device 64, and provide an output multiplied, for example, by one-half. As illustrated, the output of the monitoring circuitry 60 may provide an indication of the operational health and/or the operational state of the light source 16, the fiber optic sensor 12, and/or certain components of the decoding circuitry 14. In this way, the monitoring circuitry 60 may produce an external output signal (e.g., which may be output to a utility control center) that be used to diagnose the health and/or robustness of the light source 16 (e.g., laser) and to determine when preventative maintenance may be required.

In certain embodiments, the monitoring circuitry 60 may also provide for one or more specific advantages such as, in embodiments, for example, when the fiber optic sensor 12 may be coupled to a series capacitor installation along a high voltage transmission line. Particularly, in such an embodiment, certain components of the fiber optic current sensing system 10 may not be accessible under normal operating conditions, and can thus only be accessed during a power outage, for example. Thus by providing the monitoring circuitry 60, the utility or other utility service provider may be provided with real-time or near time diagnostic information regarding, for example, power attenuation of the light source 16, insertion loss and/or isolation of the optical circulator 22, health of the amplifiers in the low pass filters 42, 44, 48, and 50 of the decoding circuitry 14, and so forth. The monitoring circuitry 60 may also provide indication that the fibers (e.g., fibers carrying the light signals) are functional, and also that the other components of the decoding circuitry 14 are functional. Furthermore, as previously noted, it should be appreciated that the fiber optic current sensing system 10 may include multiple output channels (e.g., 9-10 output channels), and each channel may be monitored by the monitoring circuitry 60. Thus, the monitoring circuitry 60 may provide an indication as to the functionality of the components of each channel.

In other embodiments, the monitoring circuitry 60 may monitor the operational health of one or more components of the fiber optic current sensing system 10 intermittently based on, for example, the value of the measured current signal output of the decoding circuitry 14. For example, should the current signal output measure a value of approximately 0 Amps or other aberrantly low and/or high value, the monitoring circuitry 60 may generate a output to an external control system and/or other protection device (e.g., microprocessor-based protective relay) as indication of the operational health of one or more components (e.g., light source 16, fiber optic current sensor 12, and so forth) of the fiber optic current sensing system 10. Specifically, in certain embodiments, the output signal of the monitoring circuitry 60 may include an indication of the operational health of the light source 16 and the low pass filters 44 and 50, as well as the detected current signal output. In this way, because the operational health indication is included along with the current signal output, the external control system and/or external protection device may receive an indication for each channel and determine an overall power level of the light source 16 that may be used generate certain data trends over a period of time. Furthermore, utilizing the present techniques, the utility and/or utility serviceman, for example, may have an indication as to whether an aberrantly low and/or high value of the current output signal is due to, for example, a lost electric power line, or whether one or more components of the fiber optic current sensing system 10 have become inoperable.

Figure 3:
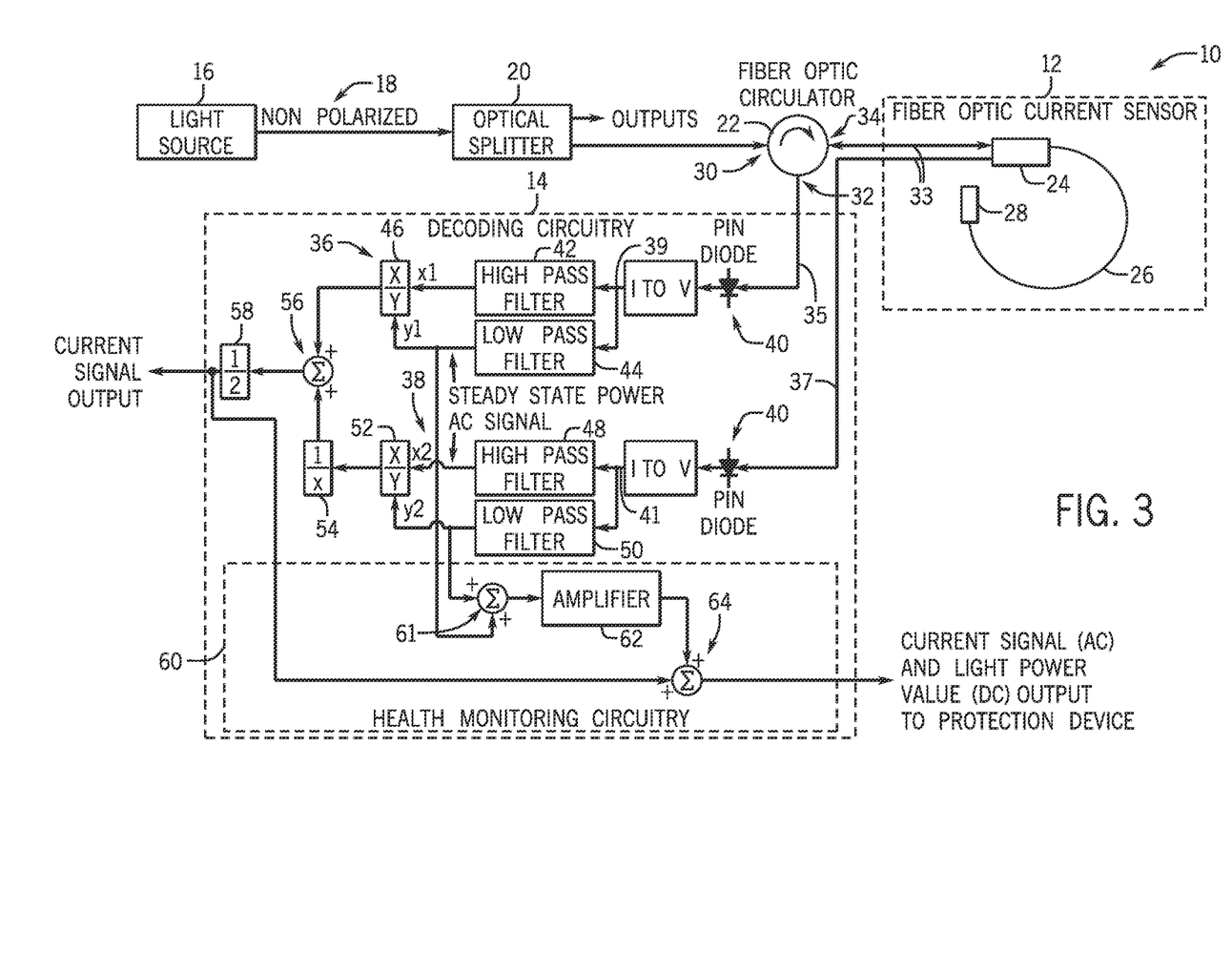
FIG. 3 is an embodiment of the fiber optic current sensing system of FIG. 2 including a reduction of components, in accordance with the present embodiments.

In another embodiment, as illustrated by FIG. 3, the output of the amplifier 62 may not be summed with the output of the divider 46 (e.g., output corresponding to a quotient value of the AC component and the DC component of the electrical signal 39) and the output of the reciprocator 54 (e.g., output corresponding to the reciprocal value of the quotient value of AC component and the DC component of the electrical signal 41). Instead, the output of the amplifier 62 may be directly summed with the output of the divider 46 and the current signal output as illustrated. In this way, the output of the health monitoring circuitry 60 may be produced while reducing hardware and/or system complexity of the health monitoring circuitry 60, and, by extension, the decoding circuitry 14.

Figure 4:
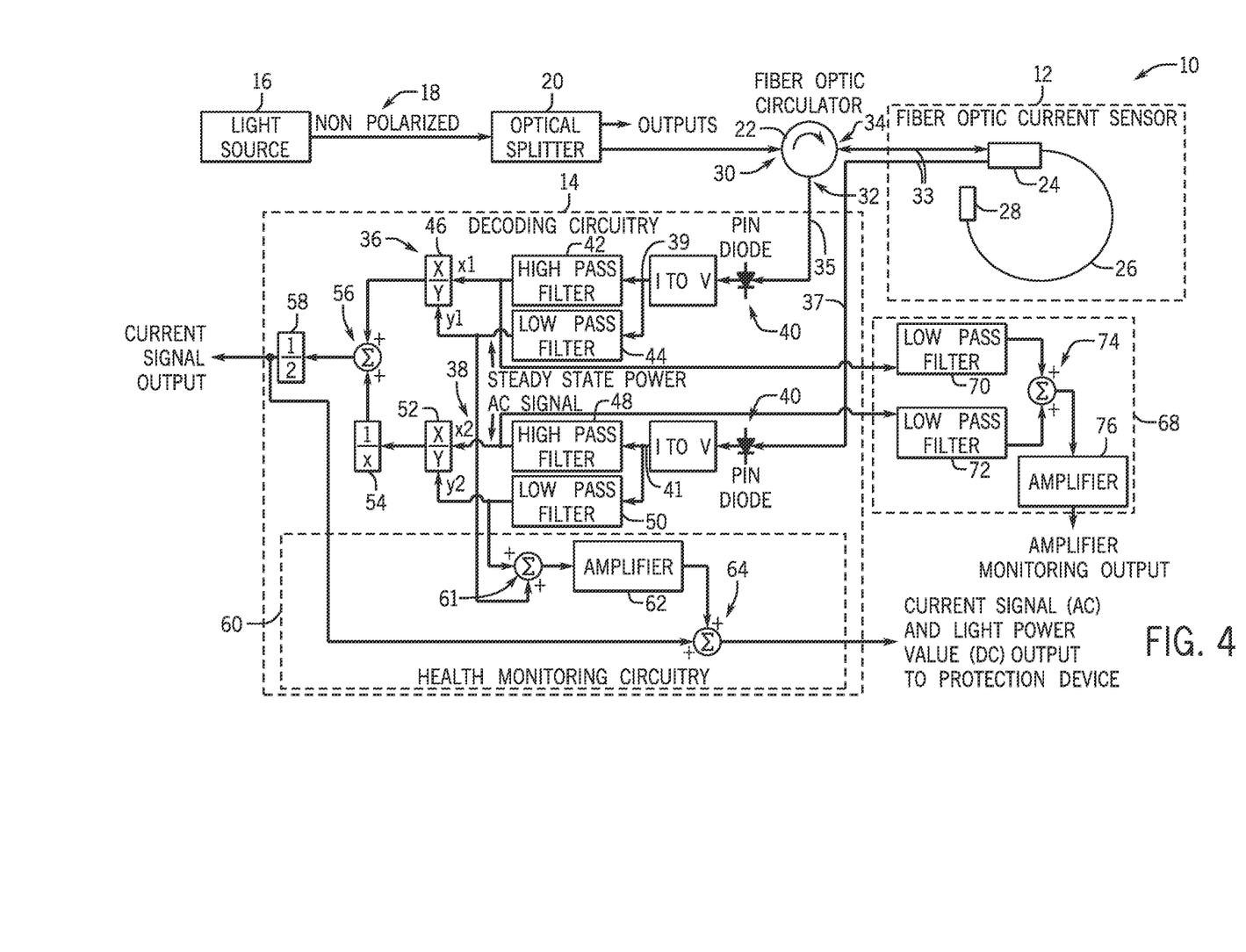
FIG. 4 is an embodiment of the fiber optic current sensing system of FIG. 2 including an additional monitoring circuit, in accordance with the present embodiments.

In certain embodiments, as illustrated by FIG. 4, in addition to, or alternatively to the health monitoring circuitry 60, the decoding circuitry 14 may also include filter health monitoring circuitry 68. Specifically, the filter health monitoring circuitry 68 may receive the respective AC components of the signals 39 and 41 (e.g., x1, x2), and provide, for example, an indication of the operational health and/or functionality of the respective high pass filters 42 and 48. As illustrated, the filter health monitoring circuitry 68 may also include a low pass filter 70 used to receive the AC component of the signal 39, and a low pass filter 72 used to receive the AC component of the signal 41. The low pass filters 70 and 72 may respectively filter out the high frequency components (e.g., AC components) of the signals 39 and 41 (e.g., x1, x2) and produce respective DC signals. Specifically, should the high pass filters begin to fail or become partially inoperable, then DC components may begin to become apparent in the signals 39 and 41 (e.g., x1, x2).

In certain embodiments, a summing device 74 may then sum the respective DC signals (e.g., corresponding to the outputs of the high pass filters 42 and 48) received from the low pass filters 70 and 72. As previously noted with respect to FIG. 2, the respective components of the signals 39 and 41 may be summed to reduce the number of outputs to be provided to an external control system and/or external protection device. In this way, a single output may be provided as an indication of the operational health of the high pass filters 42 and 48 as opposed to multiple outputs. The summing device 74 (e.g., which may be similar to the summing device 61 of the monitoring circuitry 60) may then pass the sum of the DC signals (e.g., DC components of signals 39 and 41 (x1, x2)) to an amplifier 76.

As noted similarly with respect to the amplifier 62, the amplifier 76 may include, for example, one or more active solid state devices (e.g., transistor, FET, and so forth) or other amplifying electronic device (e.g., OpAmp) that may be used to provide a power gain (G) to the output signal of the summing device 74, and thus amplify the output signal. The amplifier 76 may then output an external signal (e.g., which may be output to a utility control center). Specifically, certain electrical characteristics (e.g., frequency, signal distortion, signal noise, frequency jitter, signal instability, and so forth)

of the output of the amplifier 76 may be analyzed to determine the operational health of the high pass filters 42 and 48. In this way, the output of the filter monitoring circuitry 68 may provide an indication of the operational health and/or the operational state of the high pass filters 42 and 48, and, by extension, an indication of the operational health and/or the operational state of the decoding circuitry 14.

Figure 5:
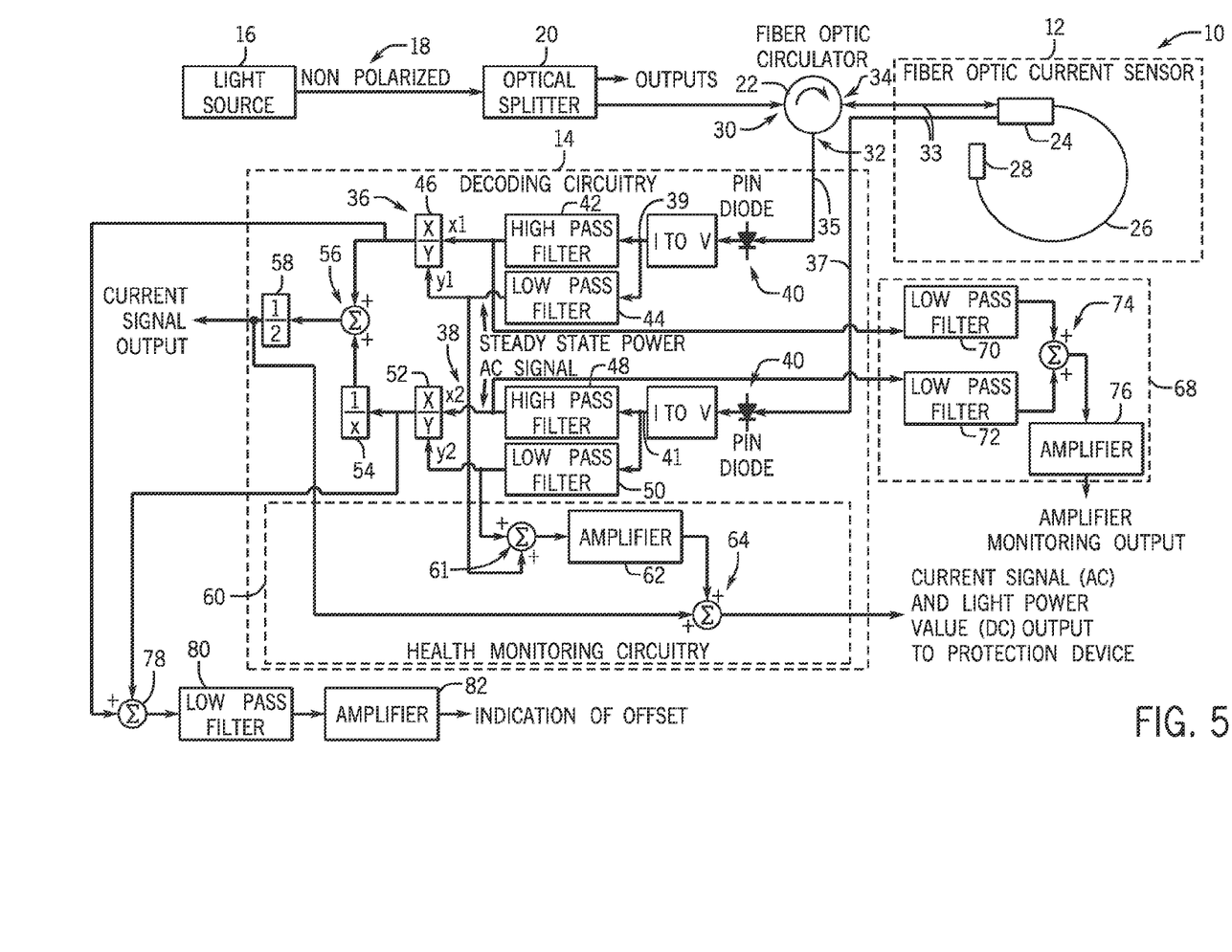
FIG. 5 is an embodiment of the fiber optic current sensing system of FIG. 4 including offset indication circuitry, in accordance with the present embodiments.

Turning now to FIG. 5, in other embodiments, in addition to, or alternatively to the health monitoring circuitry 60 and the filter health monitoring 68, the decoding circuitry 14 may also include offset monitoring circuitry that may be useful for monitoring the operational status or operational health of the multipliers and/or dividers 46 and 52. As illustrated, the signals from the respective dividers 46 and 52 may be passed to a summing device 78. In one embodiment, because of the phase relationship between the output signals of the dividers 46 and 52, the output of the summing device 78 may be an expected value of approximately zero. Thus, a non-zero output value of the summing device 78 may indicate a failing operational health or other adverse operational status of the multipliers and/or dividers 46 and 52.

For example, the summed signal may be passed to a low pass filter 80, and then to an amplifier 82. If, for example, the filtered and amplified signal value includes a relatively large non-zero value (e.g., voltage value of approximately 10 VDC or more), then the offset monitoring circuitry may provide an indication of a failing operational health of one or more electronic components (e.g., multipliers and/or dividers 46 and 52) of the decoding circuitry 14. On the other hand, for example, if the filtered and amplified signal value includes a relatively small non-zero value (e.g., voltage value of less than approximately 9-10 VDC), then the offset monitoring circuitry may provide an indication of an offset associated with the fiber optic current sensor 12, and may thus provide an indication of the operational health of the fiber optic current sensor 12.

Technical effects of the disclosed embodiments relate to a fiber optic current sensing device, which may include fiber optic operational health monitoring circuitry to provide diagnostic information about the operation and functionality of the fiber optic current sensing device. For example, the operational health monitoring circuitry may be included as part of the fiber optic current sensing device specifically to provide diagnostic data regarding the operation of the fiber optic current sensing device itself. Specifically, the operational health monitoring circuitry may monitor the direct current (DC) components of detected current signals for a variation in offset voltage outside of an expected and/or specified voltage range, which may be indicative of a failing operational health or condition of a light source or other components of the fiber optic current sensing device. In another embodiment, the operational health monitoring circuitry may monitor the alternating current (AC) components of detected current signals as an indication of a failing operational health of one or more high pass filters that may be included in the fiber optic operational health monitoring circuitry. In this way, the operational health monitoring circuitry may produce an external output signal (e.g., which may be output to a protection device or a utility control center) that be used to monitor the operational health and/or robustness of the light source and indicate when and/or if preventative maintenance may be required. Specifically, by providing the fiber optic operational health monitoring circuitry, a utility or other utility service provider may be provided with real-time or near time diagnostic information regarding, for example, power attenuation or gain of the light source, insertion loss and/or isolation, and so forth.

This written description uses examples to disclose the invention, including the best mode, and also to enable any person skilled in the art to practice the invention, including making and using any devices or systems and performing any incorporated methods. The patentable scope of the invention may be defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:
a light source configured to generate a source of light;
a fiber optic current sensor (FOCS) configured to detect the source of light;
a decoding circuitry communicatively coupled to the FOCS, wherein the decoding circuitry is configured to receive the source of light as an indication of a measurement of an electrical current and to generate a first signal and a second signal based thereon; and
a health monitoring circuitry communicatively coupled to the decoding circuitry, wherein the health monitoring circuitry is configured to:
receive a first electrical characteristic component of the first signal and a corresponding second electrical characteristic component of the second signal;
generate a summation of the first electrical characteristic component of the first signal and the second electrical characteristic component of the second signal; and
generate an output signal based at least in part on the summation of the first electrical characteristic component and the second electrical characteristic component, wherein the output signal comprises an indication of an operational condition of the light source.

2. The system of claim 1, wherein the source of light comprises light of a first polarization, and wherein first polarization comprises the indication of the measurement of the electrical current.

3. The system of claim 1, wherein the source of light comprises light of a second polarization, and wherein second polarization comprises the indication of the measurement of the electrical current.

4. The system of claim 1, wherein the light source comprises a laser configured to transmit the source of light to an optical splitter, and wherein the optical splitter is configured to divide the source of light into a plurality of sources of light.

5. The system of claim 1, wherein the health monitoring circuitry is configured to receive a first direct current (DC) component as the first electrical characteristic component and a second DC component as the second electrical characteristic component.

6. The system of claim 1, wherein the health monitoring circuitry is configured to adjust a gain of the summation of the first electrical characteristic component and the second electrical characteristic component before generating the output signal.

7. The system of claim 1, wherein the health monitoring circuitry is configured to:
receive a third electrical characteristic component of the first signal and a corresponding fourth electrical characteristic component of the second signal;
generate a summation of the third electrical characteristic component of the first signal and the fourth electrical characteristic component of the second signal; and generate a second output signal based at least in part on the summation of the third electrical characteristic component and the fourth electrical characteristic component, wherein the second output signal comprises a second indication of the operational condition of the light source.

8. The system of claim 7, wherein the health monitoring circuitry is configured to receive a first alternating current (AC) component as the third electrical characteristic component and a second AC component as the fourth electrical characteristic component.

9. The system of claim 7, wherein the health monitoring circuitry is configured to adjust a gain of the summation of the third electrical characteristic component and the fourth electrical characteristic component before generating the second output signal.

10. The system of claim 1, wherein the health monitoring circuitry is configured to generate a plurality of output signals, and wherein each output signal of the plurality of output signals corresponds to a respective one of a plurality of sources of light received by the decoding circuitry.

11. A system, comprising:
fiber optic detection circuitry, comprising:
electrical current detection circuitry configured to generate a current measurement output based on a returning light intensity received via a fiber optic current sensor; and
fiber optic health monitoring circuitry communicatively coupled to the electrical current detection circuitry, wherein the fiber optic health monitoring circuitry is configured to:
extract a first electrical characteristic component of the current measurement output and a second electrical characteristic component of the current measurement output; and
generate an output signal based at least in part on an adjusted summation of the first electrical characteristic component and the second electrical characteristic component, wherein the output signal comprises an indication of an operational health of a light source communicatively coupled to the fiber optic current sensor.

12. The system of claim 11, wherein the indication comprises an indication of a power intensity of the light received via the fiber optic current sensor.

13. The system of claim 11, wherein the fiber optic health monitoring circuitry is configured to receive a first direct current (DC) component as the first electrical characteristic component and a second DC component as the second electrical characteristic component.

14. The system of claim 11, wherein the fiber optic health monitoring circuitry is configured to:
extract a third electrical characteristic component of the current measurement output and a fourth electrical characteristic component of the current measurement output; and
generate a second output signal based at least in part on the third electrical characteristic component and the fourth electrical characteristic component, wherein the second output signal comprises a second indication of the operational health of at least one component of the fiber optic detection circuitry.

15. The system of claim 14, wherein the fiber optic health monitoring circuitry is configured to receive a first alternating current (AC) component as the third electrical characteristic component and a second AC component as the fourth electrical characteristic component, and wherein the second indication comprises a presence or an absence of a direct current (DC) component in the first AC component or the second AC component.

16. The system of claim 11, wherein the light source is configured to transmit a source of light to the fiber optic current sensor.

17. A system, comprising:
a laser configured to generate a light beam;
a fiber optic current transducer (FOCT) configured to detect the light beam;
a decoding circuitry communicatively coupled to the FOCT, wherein the decoding circuitry is configured to receive the light beam as an indication of a measurement of an electrical current and to generate a first signal and a second signal based thereon;
a first monitoring circuitry communicatively coupled to the decoding circuitry, wherein the first monitoring circuitry is configured to:
receive a direct current (DC) component of the first signal and a DC component of the second signal; and
generate an output signal based at least in part on a summation of the DC component of the first signal and the DC component of the second signal, wherein the output signal comprises an indication of an operational condition of the laser or the decoding circuitry; and
a second monitoring circuitry communicatively coupled to the decoding circuitry and the first monitoring circuitry, wherein the second monitoring circuitry is configured to:
receive an alternating current (AC) component of the first signal and an AC component of the second signal; and
generate a second output signal based at least in part on a second summation of a first characteristic of the AC component of the first signal and a second characteristic of the AC component of the second signal, wherein the second output signal comprises a second indication of an operational condition of one or more components of the decoding circuitry.

18. The system of claim 17, wherein the laser is configured to transmit the light beam to an optical splitter, and wherein the optical splitter is configured to divide the light beam into a plurality of light beams.

19. The system of claim 18, wherein the first monitoring circuitry is configured to generate respective output signals corresponding to each of the plurality of light beams, and wherein each of the respective output signals comprises a respective indication of the operational condition of the laser.

20. The system of claim 18, wherein the second monitoring circuitry is configured to generate respective output signals corresponding to each of the plurality of light beams, and wherein each of the respective output signals comprises a respective indication of the operational condition of the one or more components of the decoding circuitry.

* * * * *